(12) United States Patent
Majani

(10) Patent No.: US 6,507,613 B1
(45) Date of Patent: Jan. 14, 2003

(54) DIGITAL FILTERS AND CORRESPONDING FILTERING METHODS

(75) Inventor: Eric Majani, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/333,021

(22) Filed: Jun. 15, 1999

(30) Foreign Application Priority Data

Jun. 24, 1998 (FR) ............................................. 98 08003

(51) Int. Cl.[7] ............................................. H03H 15/00
(52) U.S. Cl. ................................................... 375/232
(58) Field of Search ................................ 375/232, 229, 375/235; 708/322, 323; 364/724.01, 724.19, 724.2

(56) References Cited

U.S. PATENT DOCUMENTS

| | | | | |
|---|---|---|---|---|
| 4,852,035 A | * | 7/1989 | Michener | 364/724.1 |
| 5,984,514 A | * | 11/1999 | Greene et al. | 364/715.02 |
| 6,195,465 B1 | * | 2/2001 | Zandi et al. | 382/48 |

OTHER PUBLICATIONS

Weidmann et al., "Significance Tree Image coding Using Balanced Multiwavelets", Proceedings of 1988 International Conference on Image Processing, ICIP 98, vol. 1, pp. 97–101.*

Nguyen et al., "Generalized Lapped Biorthogonal Transforms with Integer Coefficients", Proceedings of 1998 International Conference on Image Processing, ICIP 98, vol. 3, pp. 886–890.*

Zhang et al., "Design of Two Channel IIR Linear Phase PR Filter Bank", Proceeding of 1998, ICSP '98, 1998 Fourth International Conference on Signal Processing.*

"The Lifting Scheme; a Custom-Design Construction of Biorthogonal Wavelets"; W. Sweldens; Applied and Computational Harmonic Analysis vol. 3, No. 2, Avril, pp. 186–200(1996) Article No. 0015.

"A New Class of Two-Channel Biorthogonal Filter Banks and Wavelet Bases"; See-May Phoong et al., 8084 IEEE Transactions on Signal Processing vol. 43(1995)Mar. No. 3, N.Y. USA; pp. 649–664.

* cited by examiner

*Primary Examiner*—Don N. Vo
*Assistant Examiner*—Dung X. Nguyen
(74) *Attorney, Agent, or Firm*—Fitzpatrick, Cella, Harper & Scinto

(57) ABSTRACT

The invention proposes a digital filter adapted to transform an input digital signal into two output digital signals. The input digital signal includes input samples ($x_i$). The first output digital signal includes output samples ($y_{2i+1}$) of odd ranking, each equal to the input sample ($x_{2i}$) of the same ranking decreased by the approximate value of a sum of input samples of even ranking respectively multiplied by first filtering coefficients ($p_k$). The second output digital signal includes output samples ($y_{2i}$) of even ranking, each equal to the input sample ($x_{2i}$) of the same ranking decreased by the approximate value of a sum of output samples of odd ranking respectively multiplied by second filtering coefficients ($u_k$). The second filtering coefficients ($u_k$) are chosen from all the following sets of coefficients: (5/16, 5/16), (–1/16, 5/16, 5/16, –1/16) and (1/256, –15/256, 78/256, 78/256, –15/256, 1/256).

30 Claims, 9 Drawing Sheets

Figure 1:
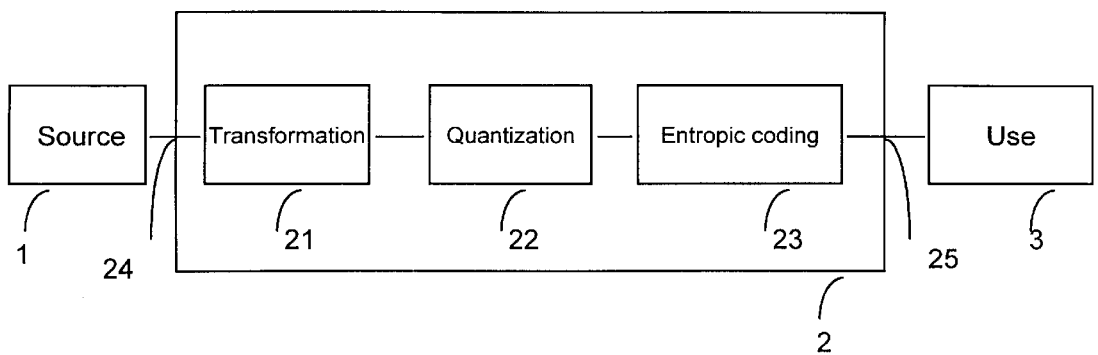

| m | p(-3) | p(-2) | p(-1) | p(0) | p(1) | p(2) | p(3) | p(4) |
|---|---|---|---|---|---|---|---|---|
| 1 | | | | 1/2 | 1/2 | | | |
| 2 | | | -1/16 | 9/16 | 9/16 | -1/16 | | |
| 3 | | 3/256 | -25/256 | 150/256 | 150/256 | -25/256 | 3/256 | |
| 4 | -5/2048 | 49/2048 | -245/2048 | 1225/2048 | 1225/2048 | -245/2048 | 49/2048 | -5/2048 |

*Fig. 7*

| n | u(-2) | u(-1) | u(0) | u(1) | u(2) | u(3) |
|---|---|---|---|---|---|---|
| 1 | | | 5/16 | 5/16 | | |
| 2 | | -1/16 | 5/16 | 5/16 | -1/16 | |
| 3 | 1/256 | -15/256 | 78/256 | 78/256 | -15/256 | 1/256 |

*Fig. 8*

| filter | m | n |
|---|---|---|
| 9/7 | 2 | 1 |
| 13/7 | 2 | 2 |
| 17/11 | 3 | 2 |

*Fig. 9*

| n1 | v(-3) | v(-2) | v(-1) | v(0) | v(1) | v(2) | v(3) |
|---|---|---|---|---|---|---|---|
| 2 | | | 1/16 | 1/2 | -1/16 | | |
| 3 | | -3/256 | 22/256 | 1/2 | -22/256 | 3/256 | |
| 4 | 5/2048 | -44/2048 | 201/2048 | 1/2 | -201/2048 | 44/2048 | -5/2048 |

*Fig. 12*

| m1 | q(-3) | q(-2) | q(-1) | q(0) | q(1) | q(2) | q(3) |
|---|---|---|---|---|---|---|---|
| 2 | | | 5/16 | 0 | -5/16 | | |
| 3 | | -1/16 | 6/16 | 0 | -6/16 | 1/16 | |
| 4 | 1/256 | -16/256 | 93/256 | 0 | -93/256 | 16/256 | -1/256 |

*Fig. 13*

| filter | n1 | m1 |
|---|---|---|
| 6/10 | 2 | 2 |
| 6/14 | 2 | 3 |
| 10/18 | 3 | 3 |

*Fig. 14*

DIGITAL FILTERS AND CORRESPONDING FILTERING METHODS

BACKGROUND OF THE INVENTION

Field of the Invention

The present invention concerns in general terms the transformation of digital signals, and concerns more particularly symmetrical biorthogonal filters with a compact support and satisfying the requirements for perfect reconstruction.

Such filters are already known. The invention aims to provide novel filters whose coding efficiency, or performance, that is to say the output/distortion ratio, is greater than that of known filters.

To this end, the invention proposes a digital filter, and a corresponding filtering method, adapted to transform an input digital signal into two output digital signals, the input digital signal including input samples, the first output digital signal including output samples of odd ranking, each output sample of odd ranking being equal to the input sample of the same ranking decreased by the approximate value of a sum of input samples of even ranking respectively multiplied by first filtering coefficients, the second output digital signal including output samples of even ranking, each output sample of even ranking being equal to the input sample of the same ranking decreased by the approximate value of a sum of output samples of odd ranking respectively multiplied by second filtering coefficients, in which the second filtering coefficients are chosen from all the following sets of coefficients: (5/16, 5/16), (−1/16, 5/16, 5/16, −1/16) and (1/256, −15/256, 78/256, 78/256, −15/256, 1/256).

These filtering coefficients make it possible to construct a family of analysis filters whose performance is better than that of known filters.

According to a preferred characteristic, the first filtering coefficients are chosen from all the following sets of coefficients: (½, ½), (−1/16, 9/16, 9/16 −1/16), (3/256, −25/256, 150/256, 150/256, −25/256, 3/256), (−5/2048, 49/2048, −245/2048, 1225/2048, 1225/2048, −245/2048, 49/2048, −5/2048).

The filters thus constructed are analysis filters of odd length.

The invention also proposes a filter, and a corresponding filtering method, adapted to transform two input digital signals into one output digital signal, a first input signal including input samples of odd ranking and a second input signal including input signals of even ranking, the output digital signal including output samples of even ranking and odd ranking, each output sample of even ranking being equal to the input sample of the same ranking decreased by the approximate value of a sum of input samples of odd ranking respectively multiplied by third filtering coefficients, each output sample of odd ranking being equal to the input sample of the same ranking increased by the approximate value of a sum of output samples of even ranking respectively multiplied by fourth filtering coefficients, in which the third filtering coefficients are chosen from all the following sets of coefficients: (5/16, 5/16), (−1/16, 5/16, 5/16, −1/16) and (1/256, −15/256, 78/256, 78/256, −15/256, 1/256).

These filtering coefficients make it possible to construct a family of synthesis filters, corresponding to the above analysis filters, and whose performance is better than that of known synthesis filters.

According to a preferred characteristic, the fourth filtering coefficients are chosen from all the following sets of coefficients: (½, ½), (−1/16, 9/16, 9/16 −1/16), (3/256, −25/256, 150/256, 150/256, −25/256, 3/256), and −5/2048, 49/2048, −245/2048, 1225/2048, 1225/2048, −245/2048, 49/2048, −5/2048).

The filters thus constructed are synthesis filters of odd length.

The invention also proposes a digital filter, and a corresponding filtering method, adapted to transform an input digital signal into two output digital signals, the input digital signal including input samples, an intermediate digital signal including intermediate samples of odd ranking, each intermediate sample of odd ranking being equal to the input sample of the same ranking decreased by the approximate value of a sum of input samples of even ranking respectively multiplied by fifth filtering coefficients, the first output digital signal including output samples of even ranking, each output sample of even ranking being equal to the input sample of the same ranking increased by the approximate value of a sum of intermediate samples of odd ranking respectively multiplied by sixth filtering coefficients, the second output digital signal including output samples of odd ranking, each output sample of odd ranking being equal to the intermediate sample of the same ranking decreased by the approximate value of a sum of intermediate samples of even ranking respectively multiplied by seventh filtering coefficients, in which the seventh filtering coefficients are chosen from all the following sets of coefficients: (5/16, 0, −5/16), (−1/16, 6/16, 0, −6/16, 1/16), and (1/256, −16/256, 93/256, 0, −93/256, 16/256, −1/256).

These filtering coefficients make it possible to construct a family of analysis filters whose performance is better than that of known filters.

According to a preferred characteristic, the sixth filtering coefficients are chosen from all the following sets of coefficients: (1/16, ½, −1/16), (−3/256, 22/256, ½, −22/256, 3/256), and (5/2048, −44/2048, 201/2048, ½, −201/2048, 44/2048, −5/2048).

The filters thus constructed are analysis filters of even length.

According to another preferred characteristic, there is a single fifth filtering coefficient and it is equal to one. Implementation is thus simplified.

The invention also concerns a filter, and a corresponding filtering method, adapted to transform two input digital signals into one output digital signal, a first input signal including input samples of odd ranking and a second input signal including input signals of even ranking, the output digital signal including output samples of even ranking and odd ranking, an intermediate digital signal including intermediate samples of odd ranking, each intermediate sample of odd ranking being equal to the input sample of the same ranking decreased by the approximate value of a sum of input samples of even ranking respectively multiplied by eighth filtering coefficients, each output sample of even ranking being equal to the input sample of the same ranking decreased by the approximate value of a sum of intermediate samples of odd ranking respectively multiplied by ninth filtering coefficients, each output sample of odd ranking being equal to the input sample of the same ranking increased by the approximate value of a sum of output samples of even ranking respectively multiplied by tenth filtering coefficients, the eighth filtering coefficients are chosen from all the following sets of coefficients: (5/16, 0, −5/16), (−1/16, 6/16, 0, −6/16, 1/16), and (1/256, −16/256, 93/256, 0, −93/256, 16/256, −1/256).

These filtering coefficients make it possible to construct a family of synthesis filters, corresponding to the above analysis filters, and whose performance is better than that of known filters.

According to a preferred characteristic, the ninth filtering coefficients are chosen from all the following sets of coefficients: (1/16, ½, −1/16), (−3/256, 22/256, ½, −22/256, 3/256), and (5/2048, −44/2048, 201/2048, ½, −201/2048, 44/2048, −5/2048).

The filters thus constructed are synthesis filters of even length.

According to another preferred characteristic there is a single tenth filtering coefficient and it is equal to one. Implementation is thus simplified.

According to preferred and alternative characteristics, the approximate value is the identity function, or the approximate value is a function of a real variable which supplies the integer which is closest to the variable, or the approximate value is a function of a real variable which supplies the integer below the variable, or the approximate value is a function of a real variable which supplies the integer higher than the variable, or again the approximate value is a function of a real variable broken down into sub-variables, the sum of which is equal to the variable, which supplies a sum of approximate values of the sub-variables, each of the approximate values of the sub-variables being as previously defined.

The invention also concerns a signal processing device including the filter as previously defined, or the means of implementing the corresponding method.

The invention also concerns a signal processing device having at least two filters as previously defined, the output signal of one of the filters being the input signal of the other filter.

The invention also concerns a digital apparatus including the signal processing device.

The advantages of the signal processing device and of the digital apparatus are identical to those disclosed previously.

An information storage means which can be read by a computer or microprocessor, whether or not integrated into the device, possibly removable, stores a program implementing the filtering method.

Figure 2:
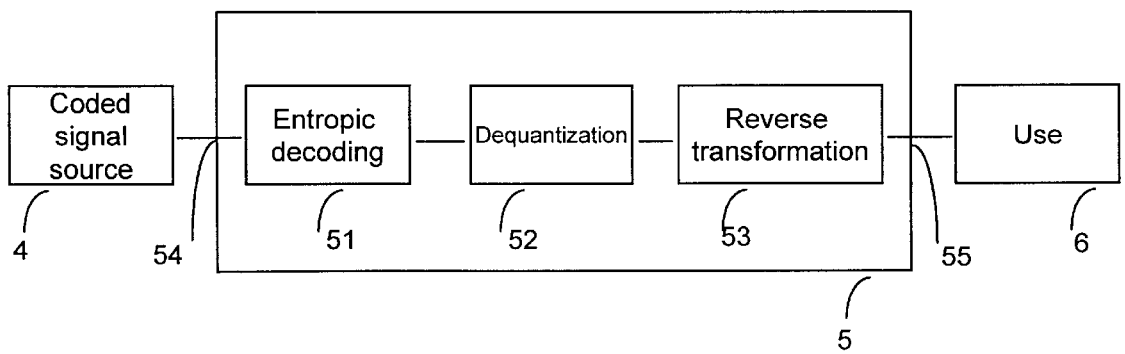
Figure 3:
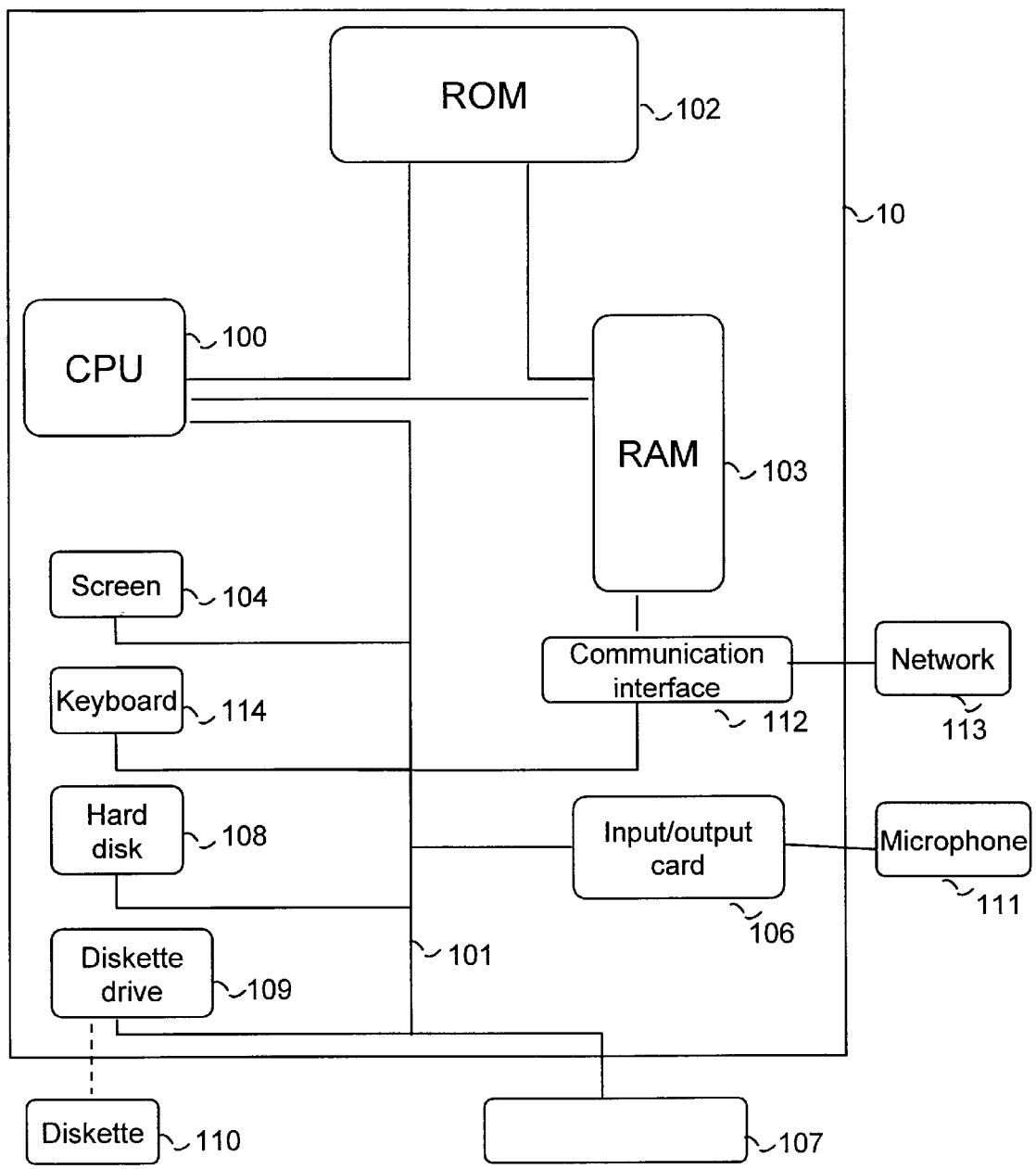
Figure 4:
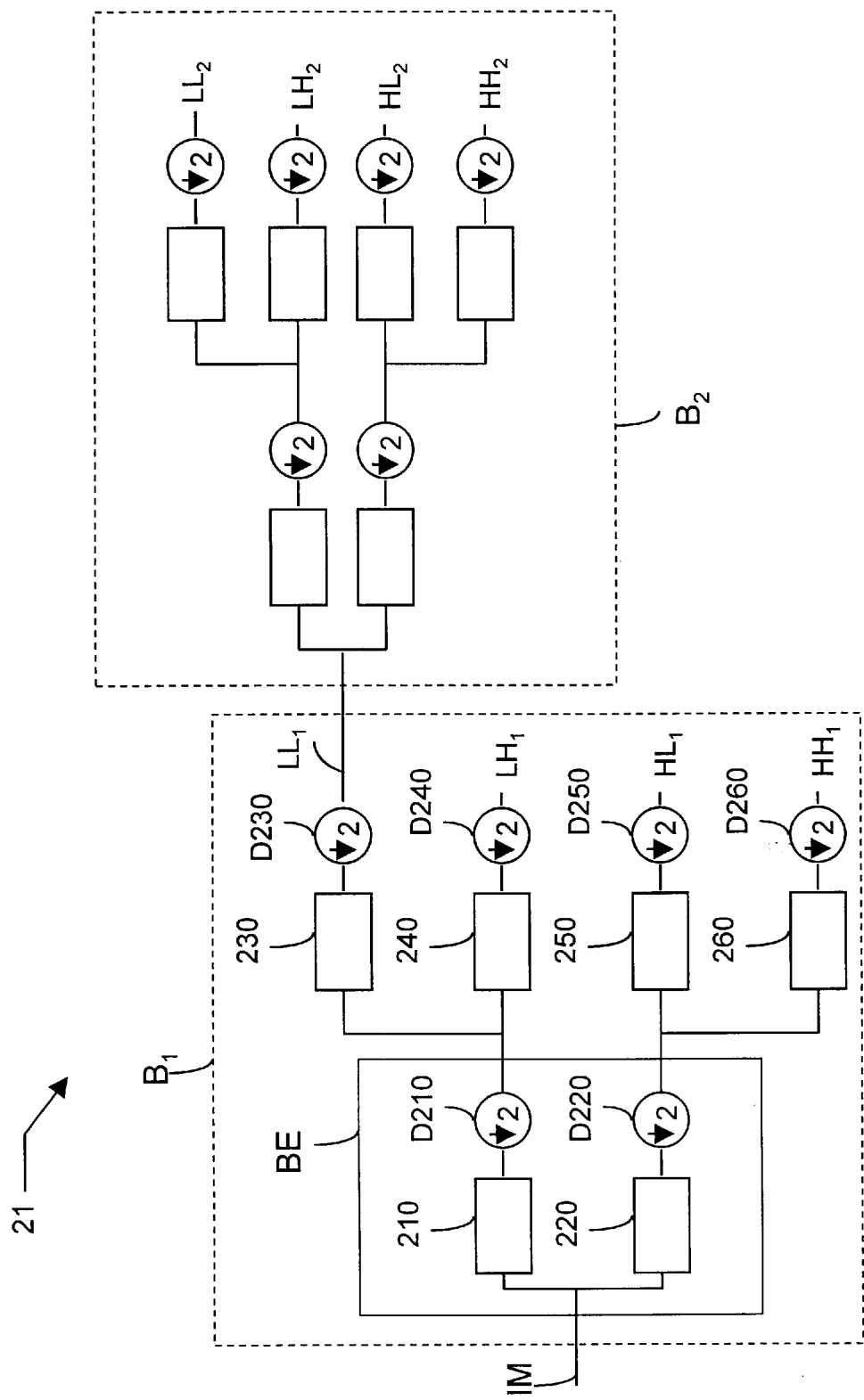
Figure 5:
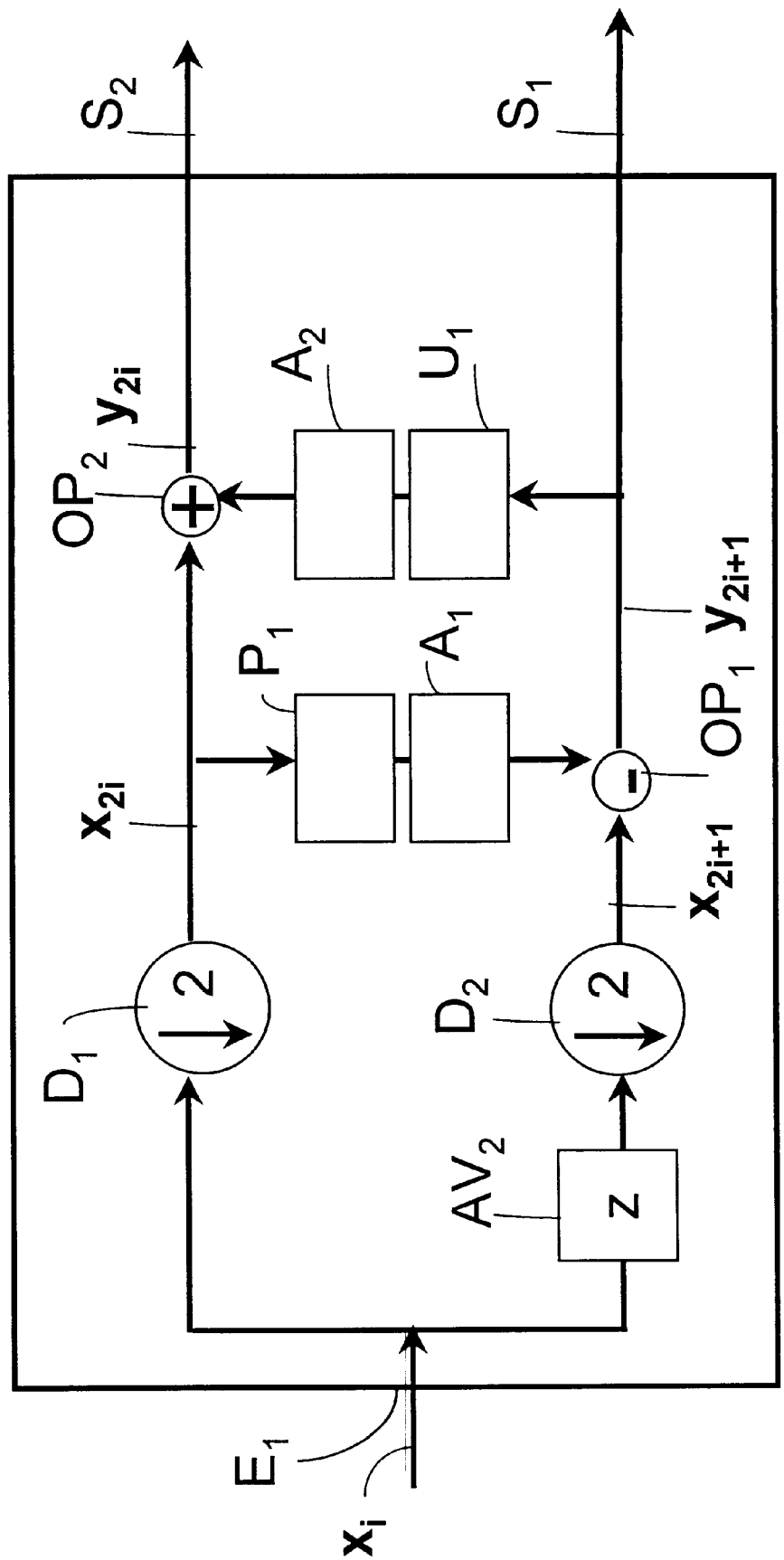
Figure 6:
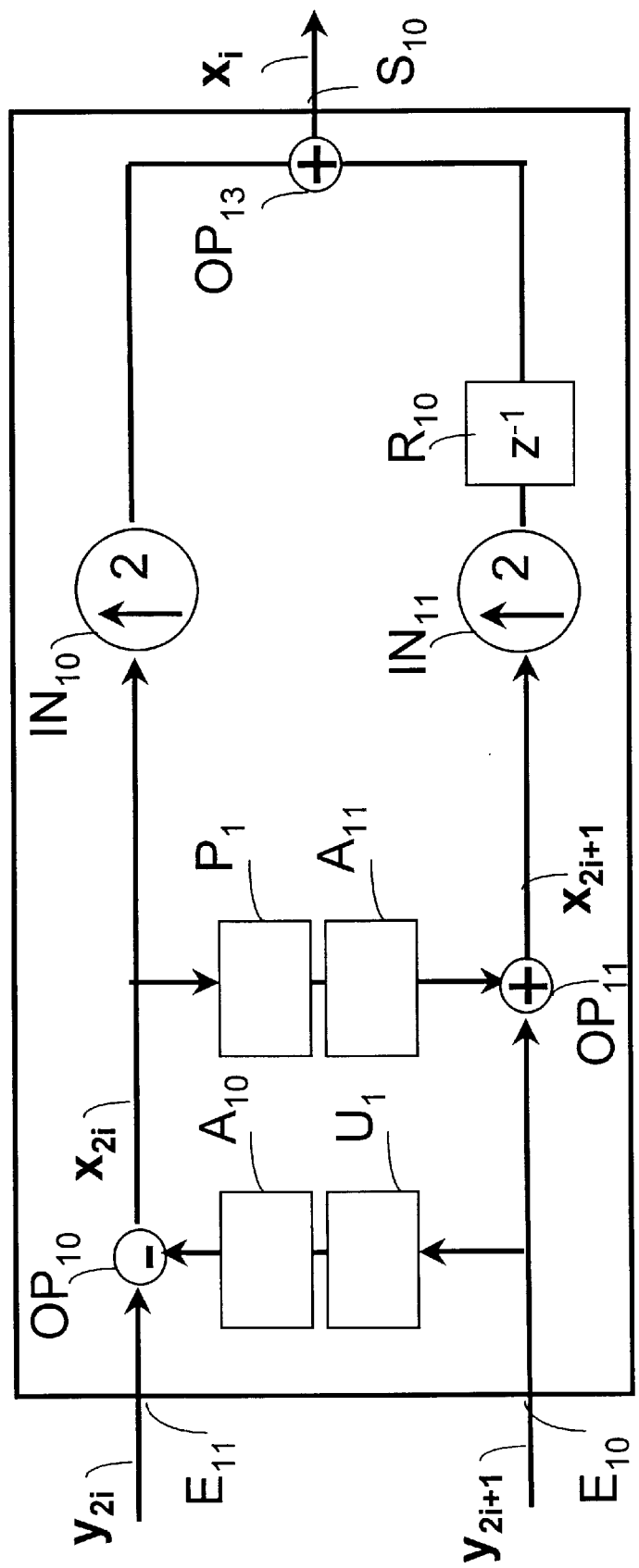
Figure 10:
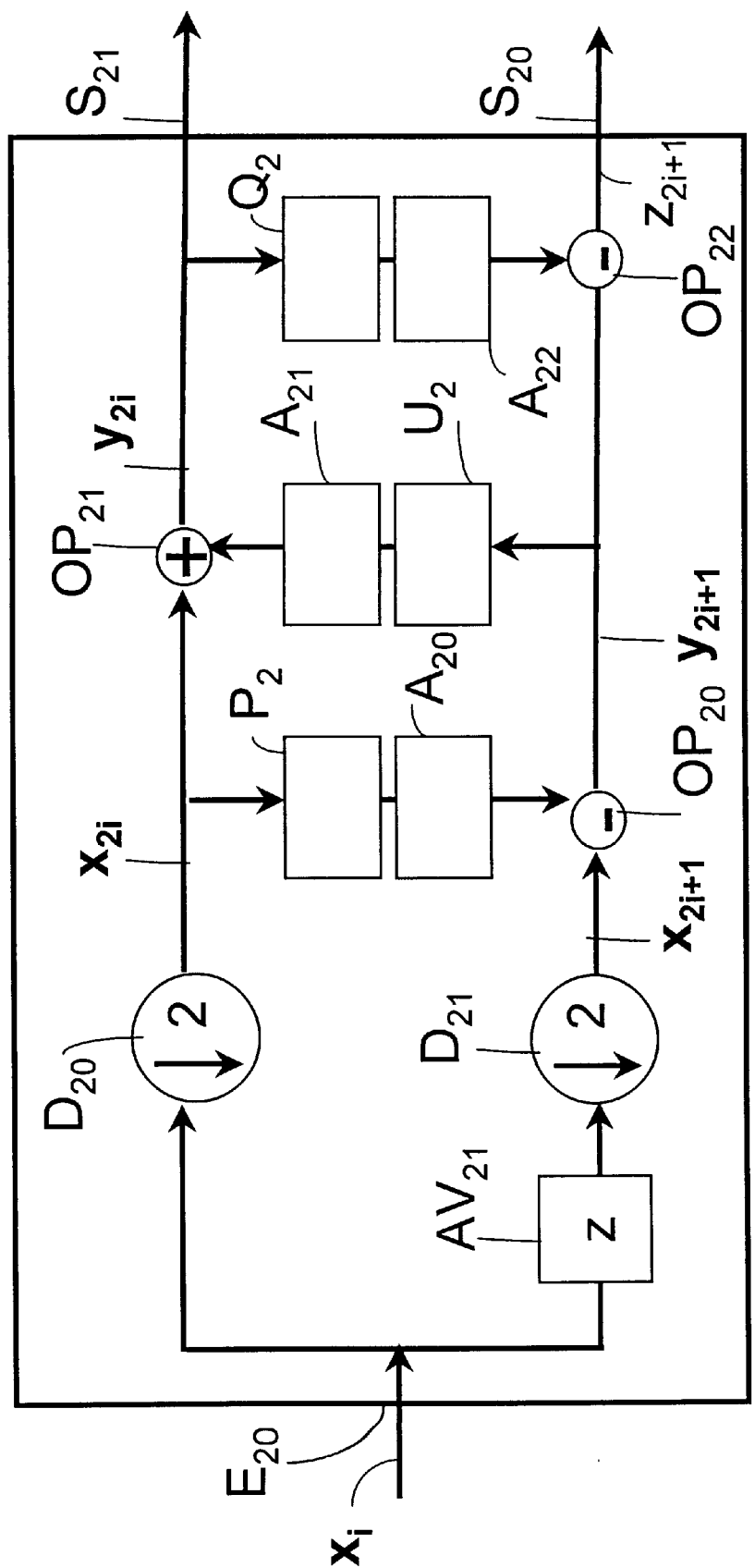
Figure 11:
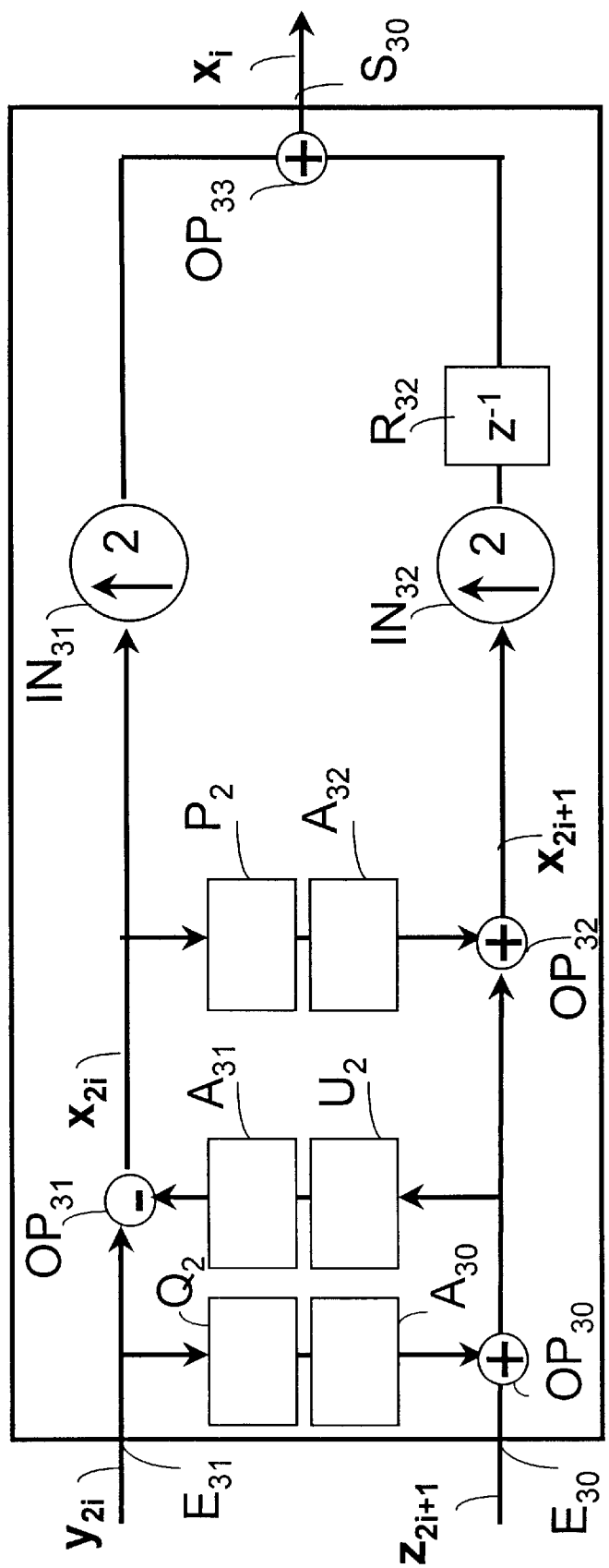

The characteristics and advantages of the present invention will emerge more clearly from a reading of a preferred embodiment illustrated by the accompanying drawings, in which:

FIG. 1 depicts schematically a data processing device according to the invention, FIG. 2 depicts schematically another data processing device according to the invention, FIG. 3 depicts an embodiment of the data processing device according to the invention, FIG. 4 depicts an embodiment of a transformation circuit included in the data processing device of FIG. 1, FIG. 5 depicts an embodiment of an elementary transformation unit according to the present invention, FIG. 6 depicts an embodiment of an elementary transformation unit according to the present invention, FIG. 7 depicts sets of filters used in the elementary transformation unit of FIGS. 5 and 6, FIG. 8 depicts sets of filters used in the elementary transformation units of FIGS. 5 and 6, FIG. 9 depicts preferred combinations of sets of filters used in the elementary transformation units of FIGS. 5 and 6, FIG. 10 depicts an embodiment of an elementary transformation unit according to the present invention, FIG. 11 depicts an embodiment of an elementary transformation unit according to the present invention, FIG. 12 depicts sets of filters used in the elementary transformation unit of FIGS. 10 and 11, FIG. 13 depicts sets of filters used in the elementary transformation unit of FIGS. 10 and 11, FIG. 14 depicts preferred combinations of sets of filters used in the elementary transformation units of FIGS. 10 and 11.

According to a chosen embodiment depicted in FIG. 1, a data processing device according to the invention is a data coding device 2 which has an input 24 to which a source 1 of non-coded data is connected. The data processing device can be integrated into a digital apparatus, such as a computer, a digital photographic apparatus or a facsimile machine, for example.

The source 1 has for example a memory means, such as a random access memory, a hard disk, a diskette or a compact disc, for storing non-coded data, this memory means being associated with a suitable reading means for reading the data therein. A means for recording the data in the memory means can also be provided. The source 1 can also be integrated into the digital apparatus.

It will more particularly be considered hereinafter that the data to be coded are a series of digital samples representing an image IM.

The source 1 supplies a digital image signal SI at the input of the coding circuit 2. The image signal SI is a series of digital words, for example bytes. Each byte value represents a pixel of the image IM, here with 256 grey levels, or black and white image. The image can be a multispectral image, for example a color image having components in three frequency bands, of the red-green-blue or luminance and chrominance type. Each band is then processed in a similar fashion to the monospectral image.

Means 3 using coded data are connected at the output 25 of the coding device 2.

The user means 3 include for example means of storing coded data, and/or means of transmitting coded data.

The coding device 2 conventionally has, starting from the input 24, a transformation circuit 21, relating particularly to the present invention, and several example embodiments of which will be detailed hereinafter. The transformations envisaged here are breakdowns into frequency sub-bands of the data signal so as to effect an analysis of the signal.

The transformation circuit 21 is connected to a quantization circuit 22. The quantization circuit uses a quantization known per se, for example a scalar quantization, or a vector quantization, of the coefficients, or groups of coefficients, of the frequency sub-bands supplied by the circuit 21.

The circuit 22 is connected to an entropic coding circuit 23, which effects an entropic coding, for example a Huffman coding, or an arithmetic coding, of the data quantized by the circuit 22.

FIG. 2 depicts another data processing device according to the invention, in the form of a device 5 for decoding data coded by the device 2.

Means 4 using coded data are connected at the input 54 of the decoding device 5. The means 4 include for example coded data memory means, and/or means of receiving the coded data which are adapted to receive the coded data transmitted by the transmission means 3.

Means 6 using decoded data are connected at the output 55 of the decoding device 5. The user means 6 are for example image display means, or sound restoration means, according to the nature of the data processed.

The decoding device 5 overall performs operations which are the reverse of those of the coding device 2. The device 5 has an entropic decoding circuit 51, which effects an entropic decoding corresponding to the coding of the circuit 23. The circuit 51 is connected to a dequantization circuit 52, corresponding to the quantization circuit 22. The circuit 52 is connected to a reverse transformation circuit 53, corresponding to the transformation circuit 21. The reverse transformation circuit 53 relates more particularly to the present invention. Several example embodiments will be detailed below. The transformations envisaged here effect a synthesis of the digital signal, from frequency sub-bands.

The coding device and the decoding device can be integrated into the same digital apparatus, for example a digital camera. In this case, the data processing device effects the coding and decoding of the data.

With reference to FIG. 3, an example of a device 10 implementing the invention is described. This device is adapted to transform a digital signal and, according to the examples developed below, to analyze it, or to synthesize it, or to analyze and then synthesize it.

The device 10 is here a microcomputer having a communication bus 101 to which there are connected:
- a central unit 100,
- a read only memory 102,
- a random access memory 103,
- a screen 104,
- a keyboard 114,
- a hard disc 108,
- a diskette drive 109 adapted to receive a diskette 110,
- an interface 112 for communicating with a communication network 113,
- an input/output card 106 connected to a microphone 111.

The hard disc 108 stores the programs implementing the invention, as well as the data to be coded and the data coded according to the invention. These programs can also be read on the diskette 110, or received via the communication network 113, or stored in read only memory 102.

More generally, the programs according to the present invention are stored in a storage means. This storage means can be read by a computer or microprocessor. This storage means is integrated or not into the device, and may be removable. For example, it may include a magnetic tape, a diskette or a CD-ROM (fixed-memory compact disc).

When the device is powered up, the programs according to the present invention are transferred into the random access memory 103, which then contains the executable code of the invention and the variables necessary for implementing the invention.

The device 10 can receive data to be coded from a peripheral device 107, such as a digital photographic apparatus, or a scanner, or any other means of acquiring or storing data.

The device 10 can also receive data to be coded from a distant device, via the communication network 113, and transmit coded data to a distant device, still via the communication network 113.

The device 10 can also receive data to be coded from the microphone 111. These data are then a sound signal.

The screen 104 enables a user notably to display the data to be coded, and serves, with the keyboard 114, as a user interface.

With reference to FIG. 4, the transformation circuit 21, or analysis circuit, is a two-level dyadic breakdown circuit. The circuit 21 is, in this embodiment, a conventional set of filters, respectively associated with decimators by two, which filter the image signal in two directions, respectively vertical and horizontal, into sub-bands signals of high and low spatial frequencies. The relationship between a high-pass filter and a low-pass filter is determined by the conditions for the perfect reconstruction of the signal. Different examples of filters will be envisaged hereinafter. It should be noted that the vertical and horizontal breakdown filters are not necessarily identical, although in practice this is generally the case. The circuit 21 here has two successive analysis units B1 and B2 for breaking down the image IM into sub-band signals according to two resolution levels.

In general terms, the resolution of a signal is the number of samples per unit length used in order to represent this signal. In the case of an image signal, the resolution of a sub-band signal is related to the number of samples per unit length used for representing this sub-band signal horizontally and vertically. The resolution depends on the number of decimations performed, on the decimation factor and on the resolution of the initial image.

The first analysis unit B1 receives the digital image signal SI and applies it to two digital filters, respectively low-pass and high-pass 210 and 220, which filter the image signal in a first direction, for example horizontal in the case of an image signal. After passing through decimators by two D210 and D220, the resulting filtered signals are respectively applied to two low-pass filters 230 and 250, and high-pass filters 240 and 260, which filter them in a second direction, for example vertical in the case of an image signal. Each resulting filtered signal passes through a respective decimator by two D230, D240, D250 and D260. The first unit delivers as an output four sub-band signals $LL_1$, $LH_1$, $HL_1$ and $HH_1$ with the highest resolution $RES_1$ in the breakdown.

The sub-band signal $LL_1$ includes the image signal components, or coefficients, of low frequency, in both directions. The sub-band signal $LH_1$ includes the image signal components of low frequency in a first direction and high frequency in a second direction. The sub-band signal $HL_1$ includes the components of high frequency in the first direction and the components of low frequency in the second direction. Finally, the sub-band signal $HH_1$ includes the components of high frequency in both directions.

Each sub-band signal is a set of real coefficients constructed from the original image, which contains information corresponding to a respectively vertical, horizontal and diagonal orientation of the image contours, in a given frequency band. Each sub-band signal can be assimilated to an image.

The sub-band signal $LL_1$ is analyzed by the analysis unit B2 similar to the previous one in order to supply four sub-band signals $LL_2$, $LH_2$, $HL_2$ and $HH_2$ of resolution level $RES_2$.

Each of the sub-band signals of resolution $RES_2$ corresponds also to an orientation in the image.

To a given analysis circuit 21 there corresponds, in a conventional fashion, a synthesis circuit whose structure is derived from that of the analysis circuit.

All the filters considered here are biorthogonal and symmetrical, with a compact support, and satisfy the requirements for perfect reconstruction.

Hereinafter, an elementary analysis unit BE having a high-pass filter, a low-pass filter and decimators, will be dealt with in particular, as well as the corresponding elementary synthesis unit, having a high-pass filter, a low-pass filter and interpolators.

Naturally, elementary analysis units BE, or respectively elementary synthesis units, can be used in combination, so that the output of one of the units is connected to the input of another unit. Thus any analysis or respectively synthesis circuit can be formed.

FIG. 5 depicts a first embodiment of an elementary transformation unit effecting here an analysis filtering of a digital signal. This embodiment is equivalent to that of the unit BE, as disclosed in the article "The Lifting Scheme: A Construction of Second Generation Wavelets", by Wim Sweldens, *Siam J. Math. Anal.*, Vol. 29, No.2, pp 511–546, 1997.

This unit has an input $E_1$ to which the signal to be transformed is applied. The signal to be transformed includes a series of samples $\{x_i\}$, where i is a sample ranking index.

The input $E_1$ is connected to a first decimator by two $D_1$ which delivers the samples $\{x_{2i}\}$ of even ranking.

The input $E_1$ is also connected to an advance $AV_2$ followed by a second decimator $D_2$, which delivers the samples $\{x_{2i+1}\}$ of odd ranking.

The first decimator $D_1$ is connected to a first filter $P_1$ which filters the samples of even ranking and supplies filtered samples to a first approximation unit $A_1$.

The filter $P_1$ and the approximation unit $A_1$ will be detailed below.

The output of the approximation unit $A_1$ and that of the second decimator $D_2$ are connected to a first operator $OP_1$, which performs a subtraction. The operator $OP_1$ is connected to a first output $S_1$ of the elementary unit, which delivers a digital signal including high-frequency samples $y_{2i+1}$ calculated according to the formula $$y_{2i+1}=x_{2i+1}-APP(\Sigma_{k=1-m}{}^{m}p_k \cdot x_{2(i+k)}) \quad (1):$$

where APP is a function produced by the approximation unit $A_1$ giving an approximate value of a real number. The approximate value can be the real number itself, the APP function then being identity. The approximate value can be the integer below the real number, the integer above the real number or the closest integer to the real number.

Where the units $P_1$ and $A_1$ are combined, the sum of samples multiplied by filtering coefficients can be broken down into partial sums, the approximate value then being a sum of approximate values, as defined above, of partial sums.

In formula (1), the parameter $p_k$ is a first filtering coefficient, that is to say the current coefficient of the filter $P_1$, the parameter k is a filtering coefficient index and the parameter m determines the length of the filter $P_1$ (which is equal to 2.m).

The output of the operator $OP_1$ is also connected to a second filter $U_1$ connected to a second approximation unit $A_2$.

The second approximation unit $A_2$ is connected to a second operator $OP_2$, to which the first decimator by two $D_1$ is also connected. The second operator $OP_2$ effects a sum.

The output of the second operator $OP_2$ is the second output $S_2$ of the transformation unit, which delivers a digital signal including low-frequency samples $y_{2i}$ calculated according to the formula $$y_{2i}=x_{2i}+APP(\Sigma_{k=1-n}{}^{n}u_k \cdot y_{2(i+k)-1}) \quad (2):$$

where $u_k$ is a second filtering coefficient, that is to say the current coefficient of the filter $U_1$, and the parameter n determines the length of the filter $U_1$.

The function APP can be one of those described previously.

FIG. 6 depicts a first embodiment of an elementary synthesis unit, that is to say the reverse transformation to that of FIG. 5. This transformation unit has a first input E10 to which a first signal to be transformed is applied and a second input E11 to which a second signal to be transformed is applied.

The signals to be transformed include here the samples obtained after analysis filtering of a digital image by the analysis unit of FIG. 5. These samples have possibly been modified by another processing between analysis and synthesis.

More precisely, the first signal to be transformed includes the high-frequency samples $\{y_{2i+1}\}$, and the second signal to be transformed includes the low-frequency samples $\{y_{2i}\}$.

The synthesis unit has a structure similar to that of the analysis unit, and can be derived from it simply. In particular, the synthesis unit uses the same filters $P_1$ and $U_1$ as the analysis unit.

The input $E_{10}$ is connected to the filter $U_1$, itself connected to an approximation unit $A_{10}$. The approximation unit $A_{10}$ is connected to an operator $OP_{10}$ to which the input $E_{11}$ is also connected. The operator $OP_{10}$ effects a subtraction.

The output of the operator $OP_{10}$ delivers a digital signal including reconstructed samples of even ranking $x_{2i}$ calculated according to the formula $$x_{2i}=y_{2i}-APP(\Sigma_{k=1-n}{}^{n}u_k \cdot y_{2(i+k)-1}) \quad (3):$$

where $u_k$ is a third filtering coefficient, here identical to the second, that is to say the current coefficient of the filter $U_1$, and the parameter n determines the length of the filter $U_1$ (which is equal to 2.n).

The function APP can be one of those described previously.

The output of the operator $OP_{10}$ is connected to the filter $P_1$, itself connected to an approximation unit $A_{11}$. The approximation unit $A_{11}$, is connected to an operator $OP_{11}$, to which the input E10 is also connected. The operator $OP_{11}$ performs an addition.

The output of the operator $OP_{11}$ delivers a digital signal including reconstructed samples of odd ranking $x_{2i+1}$ calculated according to the formula $$x_{2i+1}=y_{2i+1}-APP(\Sigma_{k=1-m}{}^{m}p_k \cdot x_{2(i+k)}) \quad (4):$$

where $p_k$ is a fourth filtering coefficient, here identical to the first, that is to say the current coefficient of the filter $P_1$, and the parameter m determines the length of the filter $P_1$ (which is equal to 2.m).

The function APP can be one of those described previously.

The output of the operator $OP_{10}$ is connected to an interpolator by two $IN_{10}$ and the output of the operator $OP_{11}$ is connected to an interpolator by two $IN_{11}$ itself connected to a delay $R_{10}$. The interpolator $IN_{10}$ and the delay $R_{10}$ are connected to an operator $OP_{13}$ which performs an addition in order to deliver at its output $S_{10}$ the signal including the reconstructed samples $x_i$.

The filter $P_1$ is now detailed with reference to FIG. 7. The filter $P_1$ is of the form $p_1(z)=\Sigma_{k=1-m}{}^{m}p_k \cdot z^k$ The set of coefficients $p_k$ is here chosen from the family of interpolator filters from Deslauriers-Dubuc, as presented in the article "The Lifting Scheme: A Custom-Design Construction of Biorthogonal Wavelets", by Wim Sweldens, published in *Applied and Computational Harmonic Analysis*, 3(2):186–200, 1996 and four examples of which, for four values of the parameter m, are given.

The first set includes the coefficients $p_0=\frac{1}{2}$ and $p_1=\frac{1}{2}$.

The second set includes the coefficients $p_{-1}=-1/16$, $p_0=9/16$, $p_1=9/16$ and $p_2=-1/16$.

The third set includes the coefficients $p_{-2}=3/256$, $p_{-1}=-25/256$, $p_0=150/256$, $p_1=150/256$, $p_2=-25/256$ and $p_3=3/256$.

The fourth set includes the coefficients $p_{-3}=-5/2048$, $p_{-2}=49/2048$, $p_{-1}=-245/2048$, $p_0=1225/2048$, $p_1=1225/2048$, $p_2=-245/2048$, $p_3=49/2048$ and $p_4=-5/2048$.

The filter $U_1$ is now detailed with reference to FIG. 8. The filter $U_1$ is of the form $U_1(z)=\Sigma_{k=1-n}^{n} u_k \cdot z^k$ According to the invention, the set of coefficients $u_k$ is chosen from amongst three sets. The first set includes the coefficients $u_0=5/16$ and $u_1=5/16$. The second set includes the coefficients $u_{-1}=-1/16$, $u_0=5/16$, $u_1=5/16$ and $u_2=-1/16$. The third set includes the coefficients $u_{-2}=1/256$, $u_{-1}=-15/256$, $u_0=78/256$, $u_1=78/256$, $u_2=-15/256$ and $u_3=1/256$.

It is possible to combine any one of the filters $P_1$ with any one of the filters $U_1$. However, certain combinations have superior performance, both theoretical and experimental.

The preferred combination are presented in the table in FIG. 9. The first preferred combination includes the filter $P_1$ having the coefficients $p_{-1}=-1/16$, $p_0=9/16$, $p_1=9/16$ and $p_2=-1/16$ and the filter $U_1$ having the coefficients $u_0=5/16$ and $u_1=5/16$. The elementary analysis and synthesis units thus produced are 9/7 filters, where 9 is the length of the low-pass filter and 7 is the length of the high-pass filter.

The second preferred combination includes the filter $P_1$ having the coefficients $p_{-1}=-1/16$, $p_0=9/16$, $p_1=9/16$ and $p_2=-1/16$ and the filter $U_1$ having the coefficients $u_{-1}=-1/16$, $u_0=5/16$, $u_1=5/16$ and $u_2=-1/16$. The elementary analysis and synthesis units thus produced are 13/7 filters where 13 is the length of the low-pass filter and 7 is the length of the high-pass filter.

The third preferred combination includes the filter $P_1$ having the coefficients $p^{-2}=3/256$, $p_{-1}=-25/256$, $p_0=150/16$, $p_1=150/16$, $p_2=-25/256$ and $p_3=3/256$ and the filter $U_1$ having the coefficients $u_{-1}=-1/16$, $u_0=5/16$, $u_1=5/16$ and $u_2=-1/16$. The elementary analysis and synthesis units thus produced are 17/11 filters where 17 is the length of the low-pass filter and 11 is the length of the high-pass filter.

The transformation units thus produced are filters of odd length. According to a balancing technique described in the book *Wavelets and Filters Banks* by Gilbert Strang and Truong Nguyen, Wellesley-Cambridge Press, 1996, pages 216 to 218, it is possible to construct a filter of even length corresponding to a filter of odd length, and vice versa.

Thus, if the analysis filters, for example of odd length, of a unit BE (FIG. 4) are denoted $H_0(z)$ and $H_1(z)$, the "twin" units $H_{0twin}(z)$ and $H_{1twin}(z)$, of even length, are calculated by means of the formulae $$H_{0twin}(z)=H_1(-z)/((1+z^{-1})/2)$$

$$H_{1twin}(z)=H_0(-z) \cdot ((1-z^{-1})/2)$$

Applying the above formulae to the filters $H_{0twin}(z)$ and $H_{1twin}(z)$ gives the filters $H_0(z)$ and $H_1(z)$.

There is therefore a biunique correspondence between a filtering of even length and a filtering of odd length. Hereinafter the construction of filters of even length will be dealt with.

FIG. 10 depicts another embodiment of an elementary transformation unit here performing an analysis filtering of a digital signal. This embodiment is equivalent to that of the unit BE, as disclosed in the article "The Lifting Scheme: A Construction of Second Generation Wavelets", by Wim Sweldens, *Siam J. Math. Anal.*, Vol. 29, No. 2, pp 511–546, 1997.

Compared with the elementary unit of FIG. 5, this embodiment is differentiated mainly by the fact that it has three filters.

This unit has an input $E_{20}$ to which the signal to be transformed is applied. The signal to be transformed includes a series of samples $\{x_i\}$, where i is a sample ranking index.

The input $E_{20}$ is connected to a first decimator by two $D_{20}$ which delivers the samples $\{x_{2i}\}$ of even ranking.

The input $E_{20}$ is also connected to an advance $AV_{21}$ followed by a second decimator $D_{21}$, which delivers the samples $\{x_{2i+1}\}$ of odd ranking.

The first decimator $D_{20}$ is connected to a first filter $P_2$ which filters the samples of even ranking and supplies them to a first approximation unit $A_{20}$.

The output of the approximation unit $A_{20}$ and that of the second decimator $D_{21}$ are connected to a first operator $OP_{20}$, which performs a subtraction. The filter $P_2$ is chosen so that $P_2(z)=1$, where 1 is a fifth filtering coefficient, and the approximation unit delivers an approximate value of a variable which is equal to the variable.

Consequently the operator $OP_{20}$ delivers intermediate samples $y_{2i+1}$ calculated according to the formula $$y_{2i+1}=x_{2i+1}-x_{2i} \tag{5}$$

This formula is a special case of formula (1), for the chosen filter $P_2$ and approximation.

The output of the first operator $OP_{20}$ is also connected to a second filter $U_2$ connected to a second approximation unit $A_{21}$.

The second approximation unit $A_{21}$ is connected to a second operator $OP_{21}$, to which the first decimator by two $D_{20}$ is also connected. The second operator $OP_{21}$ effects a sum.

The output of the second operator $OP_{21}$ is the second output $S_{21}$ of the transformation unit, which delivers a digital signal including low-frequency samples $y_{2i}$ calculated according to the formula $$y_{2i}=x_{2i}+\text{APP}(\Sigma_{k=1-n}^{n1} v_k y_{2(i+k)-1}) \tag{6}$$

where $v_k$ is a sixth filtering coefficient, that is to say the current coefficient of the filter $U_2$, and the parameter n1 determines the length of the filter $U_2$.

The function APP can be one of those described previously.

The output of the second operator $OP_2$ is also connected to a third filter $Q_2$ which filters the samples $y_{2i}$ and supplies them to a third approximation unit $A_{22}$. The operator $OP_{20}$ is also connected to the third operator $OP_{22}$, which effects a subtraction.

The operator $OP_{22}$ is connected to a first output $S_{20}$ of the elementary unit, which delivers a digital signal including high-frequency samples $z_{2i+1}$ calculated according to the formula $$z_{2i+1}=y_{2i+1}-\text{APP}(\Sigma_{k=1-m1}^{m1} q_k y_{2(i+k)}) \tag{7}$$

where the parameter $q_k$ is a seventh filtering coefficient, that is to say the current coefficient of the filter $Q_2$, and the parameter m1 determines the length of the filter $Q_2$.

The function APP can be one of those described previously.

FIG. 11 depicts another embodiment of an elementary synthesis unit, that is to say the reverse transformation to that of FIG. 10. This transformation unit has a first input E30 to which a first signal to be transformed is applied and a second input E31 to which a second signal to be transformed is applied.

The signals to be transformed include here the samples obtained after analysis filtering of a digital image by the analysis unit of FIG. 10. These samples have possibly been modified by another processing between analysis and synthesis.

More precisely, the first signal to be transformed includes the high-frequency samples $\{z_{2i+1}\}$, and the second signal to be transformed includes the low-frequency samples $\{y_{2i}\}$.

The synthesis unit has a structure similar to that of the analysis unit, and can be derived therefrom simply. In particular, the synthesis unit uses the same filters $P_2$, $U_2$ and $Q_2$ as the analysis unit.

The input $E_{30}$ is connected to an operator $OP_{30}$, which effects a sum.

The input $E_{31}$, is connected to the filter $Q_2$, itself connected to a first approximation unit $A_{30}$. The approximation unit $A_{30}$ is connected to the first operator $OP_{30}$.

The output of the operator $OP_{30}$ delivers a digital signal including intermediate samples $y_{2i+1}$ calculated according to the formula $$y_{2i+1} = z_{2i+1} + APP(\Sigma_{k=1-m1}^{m1-1} q_k y_{2(i+k)}) \qquad (8):$$

where $q_k$ is an eighth filtering coefficient, here identical to the seventh, that is to say the current coefficient of the filter $Q_2$, and the parameter m1 determines the length of the filter $Q_2$.

The function APP can be one of those described previously.

The output of the first operator $OP_{30}$ is connected to the filter $U_2$, itself connected to a second approximation unit $A_{31}$.

The second approximation unit $A_{31}$ is connected to a second operator $OP_{31}$, to which the input $E_{31}$ is also connected. The operator $OP_{31}$ effects a subtraction.

The output of the operator $OP_{31}$ delivers a digital signal including reconstructed samples of even ranking $x_{2i}$ calculated according to the formula $$x_{2i} = y_{2i} - APP(\Sigma_{k=1-n1}^{n1-1} v_k y_{2(i+k)-1}) \qquad (9):$$

Where $v_k$ is a ninth filtering coefficient, here identical to the sixth, that is to say the current coefficient of the filter $U_2$, and the parameter n1 determines the length of the filter $U_2$.

The function APP can be one of those previously described.

The output of the operator $OP_{31}$ is connected to the filter $P_2$, itself connected to an approximation unit $A_{32}$. The approximation unit $A_{32}$ is connected to a third operator $OP_{32}$, to which the output of the operator $OP_{30}$ is also connected.

As with the corresponding analysis unit, the filter $P_2$ is chosen so that $P_2(z)=1$, and the approximation unit delivers an approximate value of a variable which is equal to the variable.

The operator $OP_{32}$ effects an addition and delivers at its output a digital signal including reconstructed samples of odd ranking $x_{2i+1}$ calculated according to the formula $$x_{2i+1} = y_{2i+1} + x_{2i} \qquad (10):$$

This formula includes a tenth filtering coefficient equal to 1. The output of the operator $OP_{31}$ is connected to an interpolator by two $IN_{31}$ and the output of the operator $OP_{32}$ is connected to an interpolator by two $IN_{32}$ itself connected to a delay $R_{32}$. The interpolator $IN_{31}$ and the delay $R_{32}$ are connected to an operator $OP_{33}$ which effects an addition in order to deliver at its output $S_{30}$ the signal including the reconstructed samples $x_i$.

The filter $U_2$ is now detailed with reference to FIG. 12. The filter $U_2$ is of the form $U_2(z) = \Sigma_{k=1-n1}^{n1-1} v_k \cdot z^k$ The set of coefficients $\{v_k\}$ is constructed from the family of interpolator filters $P_1(z)$ from Deslauriers-Dubuc, as presented in the article "The Lifting Scheme: A Custom-Design Construction of Biorthogonal Wavelets", by Wim Sweldens, published in *Applied and Computational Harmonic Analysis*, 3(2):186–200, 1996. The relationship between the filter $U_2(z)$ and the filter $P_1(z)$ is: $U_2(z)=(1-P_1(z))/(1-z^{-1})$.

Three examples of filters $U_2$, for three values of the parameters n1, are given.

For n1=2, the filter $U_2$ includes the coefficients $v_{-1}=1/16$, $v_0=\frac{1}{2}$ and $v_1=-1/16$.

For n1=3, the filter $U_2$ includes the coefficients $v_{-2}=-3/256$, $v_{-1}=22/256$, $v_0=\frac{1}{2}$, $v_1=-22/256$ and $v_2=3/256$.

For n1=4, the filter $U_2$ includes the coefficients $V_{-3}=5/2048$, $v_{-2}=-44/2048$, $v_{-1}=201/2048$, $v_0=\frac{1}{2}$, $v_1=-201/2048$, $v_2=44/2048$ and $v_3=-5/2048$.

The filter $Q_2$ is now detailed with reference to FIG. 13. The filter $Q_2$ is of the form $Q_2(z)=\Sigma_{k=1-m1}^{m1-1} q_k \cdot z^k$ According to the invention, the set of coefficients $q_k$ is chosen from amongst three sets. The first set, for m1=2, includes the coefficients $q_{-1}=5/16$, $q_0=0$ and $q_1=-5/16$. The second set, for m1=3, includes the coefficients $q_{-2}=-1/16$, $q_{-1}=6/16$, $q_0=0$, $q_1=-6/16$ and $q_2=1/16$. The third set, for m1=4, includes the coefficients $q_{-3}=1/256$, $q_{-2}=-16/256$, $q_{-1}=93/256$, $q_0=0$, $q_1=-93/256$, $q_2=16/256$ and $q_3=-1/256$.

It is possible to combine any one of the filters $U_2$ with any one of the filters $Q_2$. However, certain combinations have superior performance, both theoretical and experimental.

The preferred combinations are presented in the table in FIG. 14. The first preferred combination includes the filter $U_2$ corresponding to n1=2 and the filter $Q_2$ corresponding to m1=2. The elementary analysis and synthesis units thus produced are 6/10 filters.

The second preferred combination includes the filter $U_2$ corresponding to n1=2 and the filter $Q_2$ corresponding to m1=3. The elementary analysis and synthesis units thus produced are 6/14 filters.

The third preferred combination includes the filter $U_2$ corresponding to n1=3 and the filter $Q_2$ corresponding to m1=3. The elementary analysis and synthesis units thus produced are 10/18 filters.

For all the calculation formulae presented above, the edge problems are resolved in a conventional fashion, that is to say any non-existing samples are replaced by other samples determined for example by the principle of symmetrical reflection.

In addition, all the calculation formulae presented above can be multiplied by factors, so as to form intermediate formula, which are then standardized in order to obtain the results presented. This makes it possible to reduce the approximation errors and/or to reduce the number of multiplications.

It should be noted that all the filters constructed according to the invention have coefficients whose denominators are powers of two, in order to simplify implementation. This is because a division by a power of two can be effected by a shifting of bits.

Moreover, the transformation units of FIGS. 5, 6, 10 and 11 can be implemented in the device 10 (FIG. 3), by programs performing the operations of each of the components of the units described. In addition, implementation can be effected by calculations in place, that is to say where a calculated sample is stored in place of another sample which was used for calculating it.

Naturally, the present invention is in no way limited to the embodiments described and depicted, but quite the contrary encompasses any variant within the capability of a person skilled in the art.

What is claimed is:

1. A digital filter adapted to transform an input digital signal into first and second output digital signal, includes:

an input to receive the input digital signal including input samples ($x_i$);

a first output to output the digital signal including output samples ($y_{2i+1}$) of odd ranking, each output sample of odd ranking being equal to the input sample ($x_{2i}$) of the same ranking decreased by the approximate value of a sum of input samples of even ranking respectively multiplied by first filtering coefficients ($p_k$); and a second output to output the digital signal including output samples ($y_{2i}$) of even ranking, each output sample of even ranking being equal to the input sample ($x_{2i}$) of the same ranking decreased by the approximate value of a sum of output samples of odd ranking respectively multiply by second filtering coefficients ($u_k$);

wherein the second filtering coefficients ($u_k$) are chosen from all the following sets of coefficients: (5/16, 5/16), (−1/16, 5/16, 5/16, −1/16), and (1/256, −15/256, 78/256, 78/256, −15/256, 1/256).

2. A filter according to claim 1, wherein the first filtering coefficients ($p_k$) are chosen from all the following sets of coefficients: (½, ½), (−1/16, 9/16, 9/16, −1/16), (3/256, −25/256, 150/256, 150/256, −25/256, 3/256), and (−5/2048, 49/2048, −245/2048, 1225/2048, 1225/2048, −245/2048, 49/2048, −5/2048).

3. A digital filter adapted to transform two input digital signals into one output digital signal, includes:

an input to receive a first input signal including input samples ($y_{2i+1}$) of odd ranking and a second input signal including input signals ($y_{2i}$) of even ranking;

an output to output a digital signal including output samples of even ranking and odd ranking ($x_i$);

where each output sample of even ranking being equal to the input sample of the same ranking decreased by the approximate value of a sum of input samples of odd ranking respectively multiply by third filtering coefficients ($u_k$); and where each output sample of odd ranking being equal to the input sample of the same ranking increased by the approximate value of a sum of output samples of even ranking respectively multiply by fourth filtering coefficients ($p_k$);

wherein the third filtering coefficients ($u_k$) are chosen from all the following sets of coefficients: (5/16, 5/16), (−1/16, 5/16, 5/16, −1/16), and (1/256, −15/256, 78/256, 78/256, −15/256, 1/256).

4. A filter according to claim 3, wherein the fourth filtering coefficients ($p_k$) are chosen from all the following sets of coefficients: (½, ½), (−1/16, 9/16, 9/16 −1/16), (3/256, −25/256, 150/256, 150/256, −25/256, 3/256), and (−5/2048, 49/2048, −245/2048, 1225/2048, 1225/2048, −245/2048, 49/2048, −5/2048).

5. A digital filter adapted to transform an input digital signals into first and second output digital signals, includes:

an input to receive the digital signal including input samples ($x_i$);

where an intermediate digital signal including intermediate samples of odd ranking ($y_{2i+1}$), each intermediate sample of odd ranking being equal to the input sample of the same ranking decreased by the approximate value of a sum of input samples of even ranking respectively multiplied by fifth filtering coefficients;

a first output to output the digital signal including output samples ($y_{2i}$) of even ranking, each output sample of even ranking being equal to the input sample of the same ranking increased by the approximate value of a sum of intermediate samples of odd ranking respectively multiplied by sixth filtering coefficients ($v_k$); and a second output to output the digital signal including output samples ($z_{2i+1}$) of odd ranking, each output sample ($z_{2i+1}$) of odd ranking being equal to the intermediate sample of the same ranking decreased by the approximate value of a sum of intermediate samples of even ranking respectively multiplied by seventh filtering coefficients ($q_k$);

wherein the seventh filtering coefficients ($q_k$) are chosen from all the following sets of coefficients: (5/16, 0, −5/16), (−1/16, 6/16, 0, −6/16, 1/16), and (1/256, −16/256, 93/256, 0, −93/256, 16/256, −1/256).

6. A filter according to claim 5, wherein the sixth filtering coefficients ($v_k$) are chosen from all the following sets of coefficients: (1/16, ½, −1/16), (−3/256, 22/256, ½, −22/256, 3/256, and (5/2048, −44/2048, 201/2048, ½, −201/2048, 44/2048, −5/2048).

7. A filter according to claim 5, having a single fifth filtering coefficient that is equal to one.

8. A digital filter adapted to transform two input digital signals into one output digital signal, includes:

a first input to receive the digital signal including input samples of odd ranking ($z_{i+1}$) and a second input to receive the digital signal including input signals of even ranking ($y_{2i}$); an output to output the digital signal including output samples ($x_i$) of even ranking and odd ranking;

where an intermediate digital signal including intermediate samples ($y_{2i+1}$) of odd ranking, each intermediate sample of odd ranking being equal to the input sample of the same ranking decreased by the approximate value of a sum of input samples of even ranking respectively multiplied by eighth filtering coefficients ($q_k$);

where each output sample ($x_{2i}$) of even ranking being equal to the input sample of the same ranking decreased by the approximate value of a sum of intermediate samples of odd ranking respectively multiply by ninth filtering coefficients ($v_k$); and where each output sample ($x_{2i+1}$) of odd ranking being equal to the input sample of the same ranking increased by the approximate value of a sum of output samples of even ranking respectively multiply by tenth filtering coefficients;

wherein the eighth filtering coefficients ($q_k$) are chosen from all the following sets of coefficients: (5/16, 0, −5/16), (−1/16, 6/16, 0, −6/16, 1/16), and (1/256, −16/256, 93/256, 0, −93/256, 16/256, −1/256).

9. A filter according to claim 8, wherein the ninth filtering coefficients ($v_k$) are chosen from all the following sets of coefficients: (1/16, ½, −1/16), (−3/256, 22/256, ½, −22/256, 3/256), and (5/2048, −44/2048, 201/2048, ½, −201/2048, 44/2048, −5/2048).

10. A filter according to claim 8, having a single tenth filtering coefficient that is equal to one.

11. A filter according to claim 1, wherein the approximate value is the identity function.

12. A filter according to claim 1, wherein the approximate value is a function of a real variable which supplies the integer which is closest to the variable.

13. A filter according to claim 1, wherein the approximate value is a function of a real variable which supplies the largest integer which is smaller than the variable.

14. A filter according to claim 1, wherein the approximate value is a function of a real variable which supplies the smallest integer which is greater than the variable.

15. A filter according to claim 1, wherein the approximate value is a function of a real variable broken down into sub-variables whose sum is equal to the variable, which supplies a sum of approximate values of the sub-variables.

16. A filtering method adapted to transform an input digital signal into first and second output digital signal, includes:
- an input to receive the digital signal including input samples ($x_i$);
- a first output to output the digital signal including output samples ($y_{2i+1}$) of odd ranking, each output sample of odd ranking being equal to the input sample of the same ranking decreased by the approximate value of a sum of input samples of even ranking respectively multiplied by first filtering coefficients ($p_k$); and
- a second output to output the digital signal including output samples ($y_{2i}$) of even ranking, each output sample ($y_{2i}$) of even ranking being equal to the input sample of the same ranking decreased by the approximate value of a sum of output samples of odd ranking respectively multiply by second filtering coefficients ($u_k$);
  - wherein the second filtering coefficients ($u_k$) are chosen from all the following sets of coefficients: (5/16, 5/16), (−1/16, 5/16, 5/16, −1/16), and (1/256, −15/256, 78/256, 78/256, −15/256, 1/256).

17. A filtering method according to claim 16, wherein the first filtering coefficients ($p_k$) are chosen from all the following sets of coefficients: (½, ½), (−1/16, 9/16, 9/16, −1/16), (3/256, −25/256, 150/256, 150/256, −25/256, 3/256), and (−5/2048, 49/2048, −245/2048, 1225/2048, 1225/2048, −245/2048, 49/2048, −5/2048).

18. A filtering method adapted to transform two input digital signals into one output digital signal, includes:
- A first input to receive the digital signal including input samples ($y_{2i+1}$) of odd ranking and a second input to receive the digital signal including input signals ($y_{2i}$) of even ranking;
- an output to output the digital signal including output samples ($x_i$) of even ranking and odd ranking;
- where each output sample of even ranking being equal to the input sample of the same ranking decreased by the approximate value of a sum of input samples of odd ranking respectively multiply by third filtering coefficients ($u_k$); and
- where each output sample of odd ranking being equal to the input sample of the same ranking increased by the approximate value of a sum of output samples of even ranking respectively multiply by fourth filtering coefficients ($p_k$);
  - wherein the third filtering coefficients ($u_k$) are chosen from all the following sets of coefficients: (5/16, 5/16), (−1/16, 5/16, 5/16, −1/16), and (1/256, −15/256, 78/256, 78/256, −15/256, 1/256).

19. A filtering method according to claim 18, wherein the fourth filtering coefficients ($p_k$) are chosen from all the following sets of coefficients: (½, ½), (−1/16, 9/16, 9/16 −1/16), (3/256, −25/256, 150/256, 150/256, −25/256, 3/256), and (−5/2048, 49/2048, −245/2048, 1225/2048, 1225/2048, −245/2048, 49/2048, −5/2048).

20. A filtering method adapted to transform an input digital signals into first and second output digital signals, includes:
- an input to receive the digital signal including input samples ($x_i$);
- where an intermediate digital signal including intermediate samples of odd ranking ($y_{2i+1}$), each intermediate sample of odd ranking being equal to the input sample of the same ranking decreased by the approximate value of a sum of input samples of even ranking respectively multiplied by fifth filtering coefficients;
- a first output to output the digital signal including output samples ($y_{2i}$) of even ranking, each output sample of even ranking being equal to the input sample of the same ranking increased by the approximate value of a sum of intermediate samples of odd ranking respectively multiplied by sixth filtering coefficients ($v_k$); and
- a second output to output the digital signal including output samples ($z_{2i+1}$) of odd ranking, each output sample ($z_{2i+1}$) of odd ranking being equal to the intermediate sample of the same ranking decreased by the approximate value of a sum of intermediate samples of even ranking respectively multiplied by seventh filtering coefficients ($q_k$);
  - wherein the seventh filtering coefficients ($q_k$) are chosen from all the following sets of coefficients: (5/16, 0, −5/16), (−1/16, 6/16, 0, −6/16, 1/16), and (1/256, −16/256, 93/256, 0, −93/256, 16/256, −1/256).

21. A filtering method according to claim 20, wherein the sixth filtering coefficients ($v_k$) are chosen from all the following sets of coefficients: (1/16, ½, −1/16), (−3/256, 22/256, ½, −22/256, 3/250), and (5/2048, −44/2048, 201/2048, ½, −201/2048, 44/2048, −5/2048).

22. A filtering method according to claim 20, having a single fifth filtering coefficient that is equal to one.

23. A filtering method adapted to transform two input digital signals into one output digital signal, includes:
- A first input to receive the digital signal including input samples ($z_{i+1}$) of odd ranking and a second input to receive the digital signal including input signals of even ranking ($y_{2i}$);
- an output to output the digital signal including output samples ($x_i$) of even ranking and odd ranking;
- where an intermediate digital signal including intermediate samples ($y_{2i+1}$) of odd ranking, each intermediate sample of odd ranking being equal to the input sample of the same ranking decreased by the approximate value of a sum of input samples of even ranking respectively multiplied by eighth filtering coefficients ($q_k$);
- where each output sample ($x_{2i}$) of even ranking being equal to the input sample of the same ranking decreased by the approximate value of a sum of intermediate samples of odd ranking respectively multiply by ninth filtering coefficients ($v_k$); and
- where each output sample ($x_{2i+1}$) of odd ranking being equal to the input sample of the same ranking increased by the approximate value of a sum of output samples of even ranking respectively multiply by tenth filtering coefficients;

wherein the eighth filtering coefficients ($q_k$) are chosen from all the following sets of coefficients: (5/16, 0, −5/16), (−1/16, 6/16, 0, −6/16, 1/16), and (1/256, −16/256, 93/256, 0, −93/256, 16/256, −1/256).

24. A filtering method according to claim 23, wherein the ninth filtering coefficients ($v_k$) are chosen from all the following sets of coefficients: (1/16, ½, −1/16), (−3/256, 221256, ½, −22/256, 3/256), and (5/2048, −44/2048, 201/2048, ½, −201/2048, 44/2048, −5/2048).

25. A filtering method according to claim 23, having a single tenth filtering coefficient that is equal to one.

26. A filtering method according to claim 16, wherein the approximate value is the identity function.

27. A filtering method according to claim 16, wherein the approximate value is a function of a real variable which supplies the integer which is closest to the variable.

28. A filtering method according to claim 16, wherein the approximate value is a function of a real variable which supplies the largest integer which is smaller than the variable.

29. A filtering method according to claim 16, wherein the approximate value is a function of a real variable which supplies the smallest integer which is greater than the variable.

30. A filtering method according to claim 16, wherein the approximate value is a function of a real variable broken down into sub-variables whose sum is equal to the variable, which supplies a sum of approximate values of the sub-variables.

* * * * *

UNITED STATES PATENT AND TRADEMARK OFFICE
CERTIFICATE OF CORRECTION

PATENT NO. : 6,507,613 B1
DATED : January 14, 2003
INVENTOR(S) : Eric Majani

It is certified that error appears in the above-identified patent and that said Letters Patent is hereby corrected as shown below:

<u>Title page,</u>
Item [56], References Cited, OTHER PUBLICATIONS, after "Weidmann et al.,": "1988" should read -- 1998 --.

<u>Column 1,</u>
Line 36, "-1/16)" should read -- -1/16), --;
Line 43, "9/16, 9/16" should read -- 9/16, 9/16, --.

<u>Column 2,</u>
Line 12, "-5/2048," should read -- (-5/2048, --.

<u>Column 7,</u>
Line 30, "$A_z$." should read -- $A_1$. --.

<u>Column 13,</u>
Lines 26, 48 and 54, "multiply" should read -- multiplied --;
Line 34, "-1/16," should read -- -1/16), --;
Line 62, "9/16, 9/16" should read -- 9/16, 9/16, --;
Line 67, (1$^{st}$ occurrence) "signals" should read -- signal --.

<u>Column 14,</u>
Line 29, "3/256," should read -- 3/256), --;
Line 38, "an" should read -- ¶an --;
Lines 52 and 58, "multiply" should read -- multiplied --;
Line 64, "($V_k$" should read -- ($V_k$) --.

<u>Column 15,</u>
Line 18, (2$^{nd}$ occurrence) "signal," should read -- signals, --;
Line 33, "multiply" should read -- multiplied --;
Line 47, "A" should read -- a --;
Lines 56 and 62, "multiply" should read -- multiplied --.

UNITED STATES PATENT AND TRADEMARK OFFICE
CERTIFICATE OF CORRECTION

PATENT NO. : 6,507,613 B1
DATED : January 14, 2003
INVENTOR(S) : Eric Majani

It is certified that error appears in the above-identified patent and that said Letters Patent is hereby corrected as shown below:

Column 16,
Line 3, "9/16, 9/16" should read -- 9/16, 9/16, --;
Line 8, "signals" (first occurrence) should read -- signal --;
Line 38, "3/250)," should read -- 3/256), --;
Line 44, "A" should read -- a --;
Lines 62 and 67, "multiply" should read -- multiplied --.

Column 17,
Line 8, "227256," should read -- 22/256, --.

Signed and Sealed this

Thirtieth Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,507,613 B1
APPLICATION NO. : 09/333021
DATED : January 14, 2003
INVENTOR(S) : Eric Majani It is certified that error appears in the above-identified patent and that said Letters Patent is hereby corrected as shown below:

ON THE TITLE PAGE
At Item (56), References Cited, Other Publications, on Line 2 of the listing of the publication to "Weidmann et al.;" "1988" should read --1998--.

COLUMN 1
Line 30, "decreased" should read --increased--.
Line 36, "-1/16)" should read -- -1/16),--.
Line 43, "9/16, 9/16" should read --9/16, 9/16,--.

COLUMN 2
Line 13, "-5/2048," should read --(-5/2048,--,

COLUMN 3
Line 2, "decreased" should read --increased--.

COLUMN 7
Line 30, "A$\ell$." should read --$A_1$.--.

COLUMN 13
Line 17, "$(x_{2i})$" should read --$(x_{2i+1})$--.
Line 24, "decreased" should read --increased--.
Line 26, "multiply" should read --multiplied--.
Line 34, "-1/16," (second occurrence) should read -- -1/16),--.
Line 48, "multiply" should read --multiplied--.
Line 53, "multiply" should read --multiplied--.
Line 61, "9/16, 9/16" should read --9/16, 9/16,--.
Line 66, "signals" (first occurrence) should read --signal--.

COLUMN 14
Line 29, "-3/256," should read -- -3/256),--.
Line 36, "$(z_{i+1})$" should read --$(z_{2i+1})$--.
Line 38, "an" should read --¶an--.
Line 44, "decreased" should read --increased--.
Line 51, "multiply" should read --multiplied--.
Line 56, "multiply" should read --multiplied--.
Line 63, "$(v_k$" should read --$(v_k)$--.

UNITED STATES PATENT AND TRADEMARK OFFICE
CERTIFICATE OF CORRECTION

PATENT NO. : 6,507,613 B1
APPLICATION NO. : 09/333021
DATED : January 14, 2003
INVENTOR(S) : Eric Majani It is certified that error appears in the above-identified patent and that said Letters Patent is hereby corrected as shown below:

COLUMN 15
Line 19, "signal," (second occurrence) should read --signals,--.
Line 32, "decreased" should read --increased--.
Line 34, "multiply" should read --multiplied--.
Line 48, "A" should read --a--.
Line 57, "multiply" should read --multiplied--.
Line 62, "multiply" should read --multiplied--.

COLUMN 16
Line 3, "9/16, 9/16" should read --9/16, 9/16,--.
Line 8, "signals" (first occurrence) should read --signal--.
Line 38, "3/250)," should read --3/256),--.
Line 44, "A" should read --a--.
Line 45, "$(z_{i+1})$" should read --$(z_{2i+1})$--.
Line 53, "decreased" should read --increased--.
Line 60, "multiply" should read --multiplied--.
Line 65, "multiply" should read --multiplied--.

COLUMN 17
Line 8, "221256," should read --22/256,--.

Signed and Sealed this

Second Day of January, 2007

JON W. DUDAS
*Director of the United States Patent and Trademark Office*